(12) United States Patent
Ko

(10) Patent No.: US 11,161,423 B2
(45) Date of Patent: Nov. 2, 2021

(54) BATTERY CHARGING SYSTEM FOR ELECTRIC VEHICLE AND METHOD FOR CHARGING THE ELECTRIC VEHICLE

(71) Applicants: Hyundai Motor Company, Seoul (KR); Kia Motors Corporation, Seoul (KR)

(72) Inventor: Kyu Beom Ko, Incheon (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 123 days.

(21) Appl. No.: 16/291,232

(22) Filed: Mar. 4, 2019

(65) Prior Publication Data

US 2020/0171965 A1 Jun. 4, 2020

(30) Foreign Application Priority Data

Nov. 29, 2018 (KR) .................. 10-2018-0151076

(51) Int. Cl.
*B60L 53/16* (2019.01)
*H01R 13/00* (2006.01)
*H01M 10/625* (2014.01)
*G01R 19/165* (2006.01)
*G01R 31/382* (2019.01)
*H01M 10/6567* (2014.01)
*H01M 10/613* (2014.01)

(52) U.S. Cl.
CPC .......... *B60L 53/16* (2019.02); *G01R 19/16542* (2013.01); *G01R 31/382* (2019.01); *H01M 10/613* (2015.04); *H01M 10/625* (2015.04); *H01M 10/6567* (2015.04); *H01R 13/005* (2013.01); *H01R 2201/26* (2013.01)

(58) Field of Classification Search
CPC ...... B60L 53/16; B60L 53/30; B60L 11/1874; H01M 10/613; H01M 10/625; H01M 10/6567; G01R 31/382; G01R 19/16542; H01R 13/005; H01R 2201/26
USPC ....................................... 320/104, 109, 134
See application file for complete search history.

(56) References Cited

U.S. PATENT DOCUMENTS

2013/0026998 A1* 1/2013 Dyer .................. B60L 53/00
320/150
2015/0054460 A1* 2/2015 Epstein .................. B60L 53/11
320/109

(Continued)

*Primary Examiner* — Edward Tso
*Assistant Examiner* — Aaron Piggush
(74) *Attorney, Agent, or Firm* — Morgan, Lewis & Bockius LLP

(57) ABSTRACT

A method for charging an electric vehicle may include (a) a step of determining, by a vehicle-side controller, whether to exchange cooling fluid between the vehicle and electric vehicle service equipment (EVSE), when a charge port of the vehicle and a connector of the electric vehicle service equipment are connected together, (b) a step of providing, by the vehicle-side controller, a signal for requesting the exchange of the cooling fluid to a charger-side controller when determining to exchange the cooling fluid, and (c) a step of controlling, by the vehicle-side controller, a cooling line of the vehicle through which cooling fluid of the vehicle circulates, to cause the cooling fluid of the vehicle to flow into a cooling line of the electric vehicle service equipment through the charge port.

15 Claims, 4 Drawing Sheets

(56) References Cited

U.S. PATENT DOCUMENTS

2017/0232865 A1* 8/2017 Christen ............. H01M 10/625
                                                          429/120
2019/0047429 A1* 2/2019 Torkelson ........... H01M 10/486

* cited by examiner

BATTERY CHARGING SYSTEM FOR ELECTRIC VEHICLE AND METHOD FOR CHARGING THE ELECTRIC VEHICLE

CROSS-REFERENCE TO RELATED APPLICATION

The present application claims priority to Korean Patent Application No. 10-2018-0151076, filed on Nov. 29, 2018, the entire contents of which is incorporated herein for all purposes by this reference.

BACKGROUND OF THE INVENTION

Field of the Invention

The present invention relates to a battery charging system for an electric vehicle and a method for charging the electric vehicle.

Description of Related Art

Electric vehicles have been widely used all over the world due to environmental regulations, and facilities and apparatuses associated with charging of the electric vehicles have emerged as a major issue.

A battery operating as a power source in an electric vehicle (EV), including a plug-in hybrid electric vehicle (PHEV), may be charged fast by use of a direct current (DC) power supply (fast charging equipment) directly connected to the battery or may be charged slowly by use of an alternating current (AC) power supply connected to the vehicle.

The electric vehicle may receive electric power from electric vehicle service equipment to charge the battery. In the instant case, the electric power may be supplied from the electric vehicle service equipment to the battery of the electric vehicle, with a charge port of the electric vehicle and a connector of the electric vehicle service equipment connected together.

A battery charging system in the electric vehicle may have a cooling line, through which cooling fluid flows, to maintain the battery module at an appropriate temperature and efficiently charge the battery.

To effectively perform the charging by maintaining the battery at the appropriate temperature while the electric vehicle is being charged, the cooling line of the vehicle operates while consuming the electric power of the battery. In the instant case, charging power may be saved by reducing the amount of energy used, which may lead to a reduction in charging time and battery charging fee according to an amount of charge.

Accordingly, a technology for reducing charging power consumed to charge a battery is required.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing reducing charging power consumed to charge a battery of an electric vehicle.

Another aspect of the present invention is to increase battery charging efficiency by maintaining a battery at an appropriate temperature.

The technical problems to be solved by the present inventive concept are not limited to the aforementioned problems, and any other technical problems not mentioned herein will be clearly understood from the following description by those skilled in the art to which the present invention pertains.

According to various aspects of the present invention, a method for charging an electric vehicle may include (a) a step of determining, by a vehicle-side controller, whether to exchange cooling fluid between the vehicle and electric vehicle service equipment (EVSE), when a charge port of the vehicle and a connector of the electric vehicle service equipment are connected together, (b) a step of providing, by the vehicle-side controller, a signal for requesting the exchange of the cooling fluid to a charger-side controller when determining to exchange the cooling fluid, and (c) a step of controlling, by the vehicle-side controller, a cooling line of the vehicle through which cooling fluid of the vehicle circulates, to cause the cooling fluid of the vehicle to flow into a cooling line of the electric vehicle service equipment through the charge port.

According to various aspects of the present invention, a battery charging system for an electric vehicle may include at least one processor, a cooling line connected to the at least one processor and having cooling fluid circulating therethrough to cool a battery of the vehicle, and a memory connected to the at least one processor and storing a plurality of instructions.

The instructions, when executed, cause the processor to determine whether to exchange the cooling fluid between the vehicle and electric vehicle service equipment, when a charge port of the vehicle and a connector of the electric vehicle service equipment are connected together, provide a signal for requesting the exchange of the cooling fluid to a charger-side controller when determining to exchange the cooling fluid, and control a cooling line of the vehicle to cause the cooling fluid of the vehicle to flow into a cooling line of the electric vehicle service equipment through the charge port.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
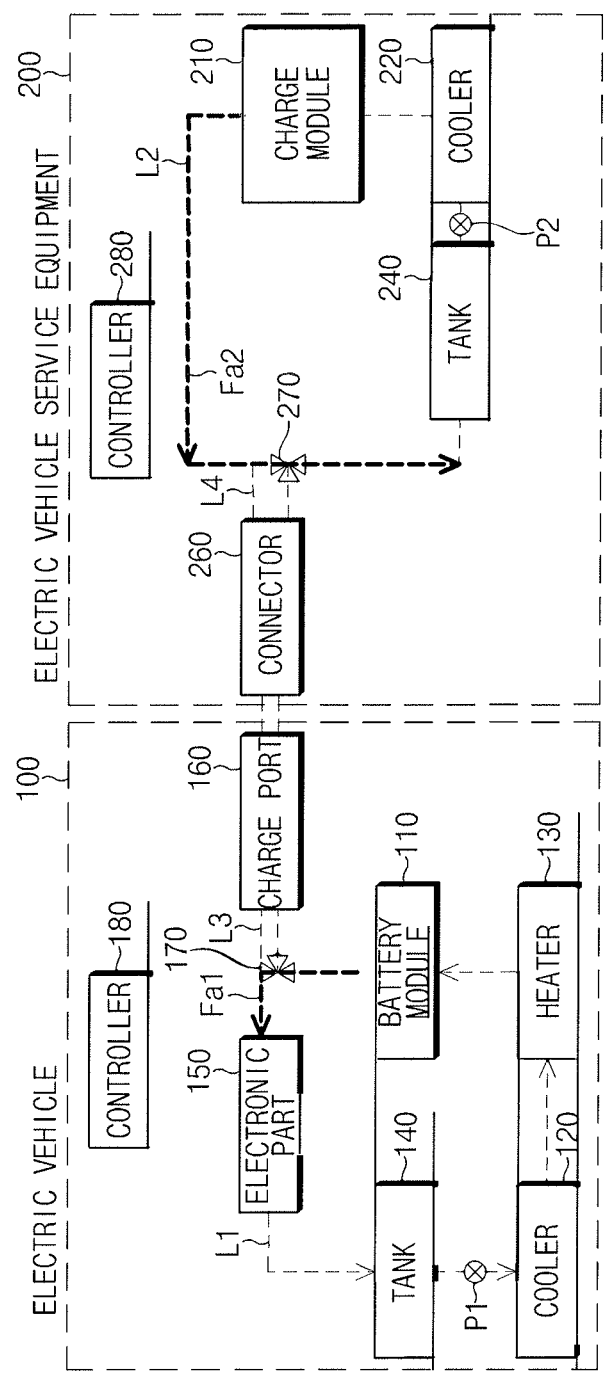
FIG. 1 is a schematic view exemplarily illustrating a battery charging system of an electric vehicle according to an exemplary embodiment of the present invention and electric vehicle service equipment.

It may be understood that the appended drawings are not necessarily to scale, presenting a somewhat simplified representation of various features illustrative of the basic principles of the invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the other hand, the invention(s) is/are intended to cover not only the exemplary embodiments, but also various alternatives, modifications, equivalents and other embodiments, which may be included within the spirit and scope of the invention as defined by the appended claims.

Terms, such as "first", "second", "A", "B", "(a)", "(b)", and the like, may be used herein to describe components of the present invention. Such terms are only used to distinguish one component from another component, and the substance, sequence, order, or number of these components is not limited by these terms. If a component were described as "connected", "coupled", or "linked" to another component, they may mean the components are not only directly "connected", "coupled", or "linked" but also are indirectly "connected", "coupled", or "linked" via a third component.

Figure 2:
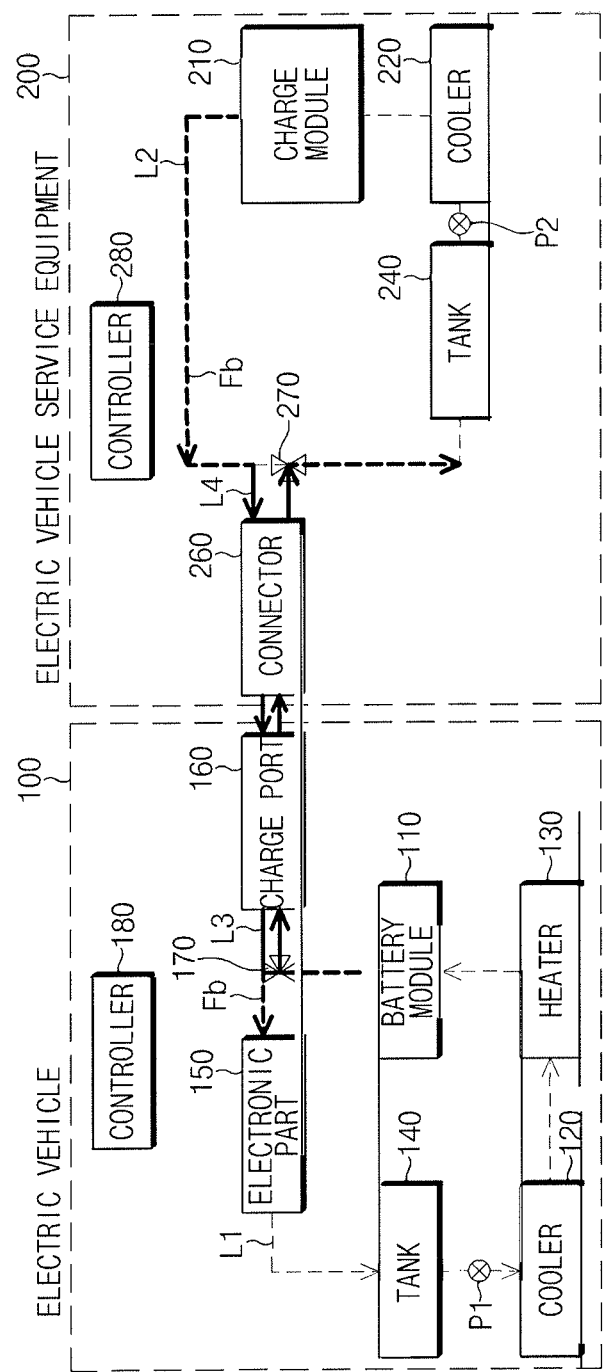
FIG. 2 is a view exemplarily illustrating a state in which the battery charging system of the electric vehicle and the electric vehicle service equipment of FIG. 1 are coupled together.

FIG. 1 is a schematic view exemplarily illustrating a battery charging system 100 of an electric vehicle according to an exemplary embodiment of the present invention and electric vehicle service equipment 200. FIG. 2 is a view exemplarily illustrating a state in which the battery charging system 100 of the electric vehicle and the electric vehicle service equipment 200 of FIG. 1 are coupled together.

The battery charging system 100 of the electric vehicle according to the exemplary embodiment of the present invention includes a battery module 110, an electronic part 150, a charge port 160, a vehicle-side controller 180, and a cooling line L1. The battery charging system 100 may not include some of the components, but includes the battery module 110, the vehicle-side controller 180, and the cooling line L1.

The cooling line L1 of the vehicle may include a valve 170 for regulating the flow of cooling fluid, a cooler 120 for cooling the cooling fluid flowing through the cooling line L1, a heater 130 for heating the cooling fluid flowing through the cooling line L1, a tank 40 for storing the cooling fluid flowing through the cooling line L1, and a circulation pump for circulating the cooling fluid.

For example, the cooling fluid of the vehicle may include at least one of water, oil, and the like.

The cooling line L1 of the vehicle may cool not only the battery module 110 but also the electronic part 150 included in the vehicle.

The battery module 110 may include a battery which may be recharged and discharge electricity and a battery state acquisition device configured for obtaining a state of the battery. For example, the battery state acquisition device may obtain the state of charge (SOC) value of the battery and the temperature of the battery. The battery module 110 may provide the state of the battery obtained to the vehicle-side controller 180.

For charging of the battery charging system 100 of the electric vehicle according to the exemplary embodiment of the present invention, the electric vehicle service equipment (EVSE) 200 coupled with the battery charging system 100 includes a charger module 210, a connector 260, a charger-side controller 280, and a cooling line L2 of a charger.

The cooling line L2 of the charger may include a valve 270 for regulating the flow of cooling fluid, a cooler 220 for cooling the cooling fluid flowing through the cooling line L2 of the charger, and a tank 240 for storing the cooling fluid flowing through the cooling line L2 of the charger.

For example, the cooling fluid of the charger may include at least one of water, oil, and the like.

The charge port 160 and the connector 260 may be electrically coupled together. The charge port 160 and the connector 260 may exchange the cooling fluid with each other.

Various types of charge ports and connectors may be used, with or without change, as the charge port 160 and the connector 260.

For example, charge ports of electric vehicles and connectors of electric vehicle service equipment have country-specific specifications. The charge port 160 and the connector 260 meet the specification requirements, but may further include a flow passage for exchanging the cooling fluid.

For example, in an exemplary embodiment of the present invention, the charge port 160 may include a cooling passage L3 that branches from the cooling line L1 of the vehicle and extends to a distal end portion of the charge port 160, and the connector 260 may include a cooling passage L4 that branches from the cooling line L2 of the charger and extends to a distal end portion of the connector 260. The cooling passage of the charge port 160 and the cooling passage of the connector 260 may be coupled together when the charge port 160 and the connector 260 are coupled together, and the present structure may be implemented with well-known structures in the related art for coupling flow passage tubes.

Referring to FIG. 1, in the state in which the cooling line L1 of the vehicle and the cooling line L2 of the charger are not coupled together, the cooling fluid of the vehicle flows along the cooling line L1 of the vehicle (see Fa1 of FIG. 1), and the cooling fluid of the charger flows along the cooling line L2 of the charger (see Fa2 of FIG. 1).

The circulation pump P1 may operate to cause the cooling fluid to flow through the cooling line L1 of the vehicle at a preset flow rate. For example, the circulation pump may operate to cause the cooling fluid to flow through the cooling line L1 of the vehicle at preset 12 liters per minute (LPM).

A circulation pump P2 may operate to cause the cooling fluid to flow through the cooling line L2 of the charger at a preset flow rate. For example, the circulation pump may operate to cause the cooling fluid to flow through the cooling line L2 of the charger at preset 12 liters per minute (LPM).

Referring to FIG. 2, in the state in which the cooling line L1 of the vehicle and the cooling line L2 of the charger are coupled together, the cooling fluid of the vehicle flows into the cooling line L2 of the charger, and the cooling fluid of the charger flows into the cooling line L1 of the vehicle.

When the cooling line L1 of the vehicle and the cooling line L2 of the charger are coupled together, the valve 170 of the vehicle may be controlled to allow the cooling fluid to flow from the cooling line L1 of the vehicle to the charge port 160 and allow the cooling fluid to flow from the charge port 160 to the cooling line L1 of the vehicle. Furthermore, the valve 270 of the charger may be controlled to allow the cooling fluid to flow from the cooling line L2 of the charger to the connector 260 and allow the cooling fluid to flow from the connector 260 to the cooling line L2 of the charger.

Accordingly, mixed cooling fluid in which the cooling fluid of the vehicle and the cooling fluid of the charger are mixed with each other may flow through the cooling line L1 of the vehicle and the cooling line L2 of the charger (see Fb of FIG. 2).

In the instant case, the cooling fluid of the vehicle and the cooling fluid of the charger may preferably have similar chemical properties since the cooling fluid of the vehicle and the cooling fluid of the charger are mixed with each other. For example, both the cooling fluid of the vehicle and the cooling fluid of the charger may be cooling oil or cooling water.

When the cooling fluid of the vehicle and the cooling fluid of the charger are mixed with each other, the temperature of the mixed cooling fluid may be between the temperature of the cooling fluid of the vehicle and the temperature of the cooling fluid of the charger.

To cause the mixed cooling fluid to flow through the cooling line L1 of the vehicle and the cooling line L2 of the charger at a preset flow rate, the circulation pump of the vehicle may have to be operated at higher speed than before the cooling line L1 of the vehicle and the cooling line L2 of the charger are coupled together, and the circulation pump of the charger may have to be operated at higher speed than before the cooling line L1 of the vehicle and the cooling line L2 of the charger are coupled together.

Therefore, when the cooling line L1 of the vehicle and the cooling line L2 of the charger are coupled together, the vehicle-side controller 180 may control the circulation pump of the vehicle to operate at higher speed than before the cooling line L1 of the vehicle and the cooling line L2 of the charger are coupled together.

Furthermore, when the cooling line L1 of the vehicle and the cooling line L2 of the charger are coupled together through the cooling passages L3 and L4, the charger-side controller 280 may control the circulation pump of the charger to operate at higher speed than before the cooling line L1 of the vehicle and the cooling line L2 of the charger are coupled together.

The vehicle-side controller 180 may include a processor and a memory.

The vehicle-side controller 180 may control the overall configuration of the battery charging system 100. The vehicle-side controller 180 may be implemented with one or more vehicle-side controllers 180. The vehicle-side controller 180 may obtain information or signals regarding the battery charging system 100 from the components of the battery charging system 100.

The memory may store instructions. The processor may execute the instructions to perform processes that will be described below. The vehicle-side controller 180 may be integrated with a controller included in another device of the vehicle other than the battery charging system 100.

The vehicle-side controller 180 may be implemented as a non-volatile computer readable medium including executable program commands. Examples of the computer readable medium may include, but are not limited to, a read-only memory (ROM), a random access memory (RAM), a compact disk (CD)-ROM, a magnetic tape, a floppy disk, a flash drive, and a smart card, and an optical data storage device.

The vehicle-side controller 180 may be implemented with at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing other functions.

The charger-side controller 280 may include a processor and a memory. The description of the vehicle-side controller 180 may be applied to the charger-side controller 280.

Figure 3:
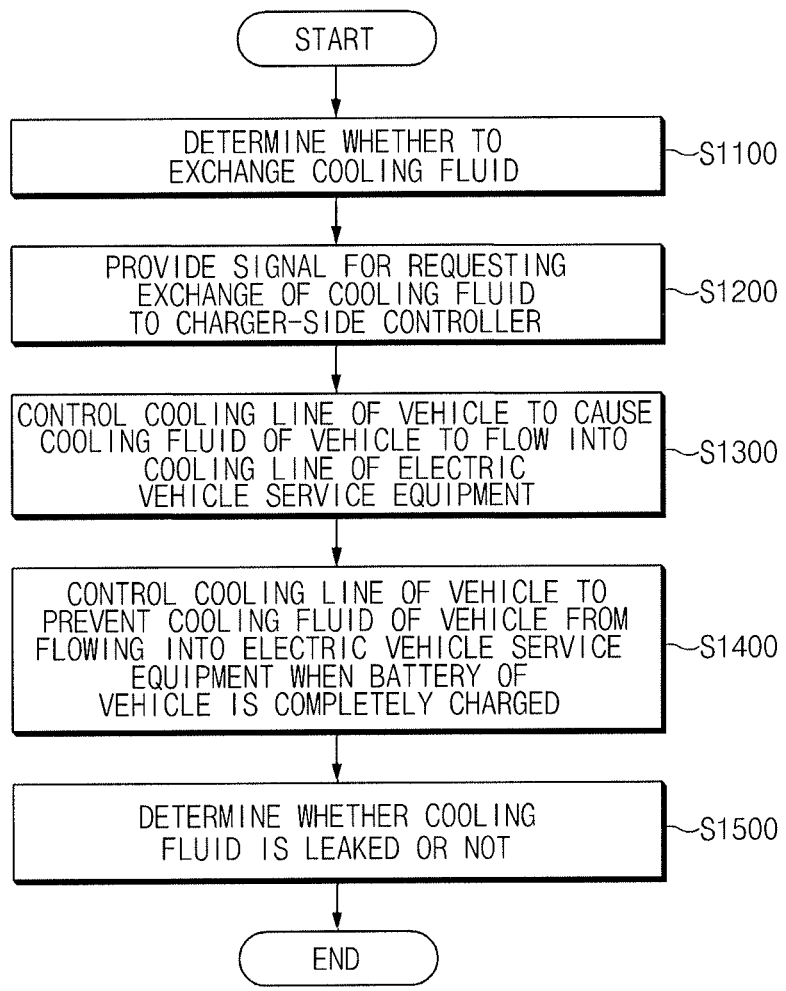
FIG. 3 is a flowchart illustrating a method of controlling the battery charging system of the electric vehicle according to an exemplary embodiment of the present invention.

FIG. 3 is a flowchart illustrating a method of controlling the battery charging system 100 of the electric vehicle according to an exemplary embodiment of the present invention.

Hereinafter, a method of charging the electric vehicle using the battery charging system 100 and the electric vehicle service equipment 200 described above will be described with reference to FIG. 3.

First, when the charge port 160 of the vehicle and the connector 260 of the electric vehicle service equipment 200 are connected to each other, the vehicle-side controller 180 determines whether to exchange the cooling fluid between the vehicle (The battery charging system 100) and the electric vehicle service equipment 200 (Step S1100).

When the charge port 160 of the vehicle and the connector 260 of the electric vehicle service equipment 200 are connected to each other, the vehicle-side controller 180 may perform charge control to charge the battery module 110 of the vehicle with electric power supplied from the electric vehicle service equipment 200.

The vehicle-side controller 180 may determine whether to exchange the cooling fluid between the vehicle and the electric vehicle service equipment 200, based on at least one of charging current flowing from the electric vehicle service equipment 200 to the vehicle, the temperature of the battery, the SOC value of the battery, information related to the cooling fluid of the vehicle, and information related to the cooling fluid of the charger. The process of determining whether to exchange the cooling fluid between the vehicle and the electric vehicle service equipment 200 will be described below in more detail with reference to FIG. 4.

Next, the vehicle-side controller 180, when determining to exchange the cooling fluid, may provide a signal for requesting the exchange of the cooling fluid, to the charger-side controller 280 (Step S1200).

For example, the vehicle-side controller 180 may transmit the signal to the charger-side controller 280 to allow the cooling fluid to flow from the cooling line L2 of the charger to the connector 260 and allow the cooling fluid to flow from the connector 260 to the cooling line L2 of the charger. The charger-side controller 280, when receiving the corresponding signal, may control the valve 270 of the charger to allow the cooling fluid to flow from the cooling line L2 of the charger to the connector 260 and allow the cooling fluid to flow from the connector 260 to the cooling line L2 of the charger.

As such, the vehicle-side controller 180 may control the cooling line L1 of the vehicle, through which the cooling fluid of the vehicle flows, to cause the cooling fluid of the vehicle to flow into the cooling line L2 of the charger through the charge port 160 (Step S1300).

For example, to cause the cooling fluid of the vehicle to flow into the cooling line L2 of the charger through the charge port 160, the vehicle-side controller 180 may control the valve 170 to cause the cooling fluid of the vehicle to flow from the cooling line L1 of the vehicle through the charge port 160 and the connector 260 to the cooling line L2 of the charger.

In an exemplary embodiment of the present invention, the vehicle-side controller 180 may control the cooling fluid circulation pump P1 of the vehicle to circulate the cooling fluid of the vehicle through the cooling line L1 of the vehicle and the cooling line L2 of the charger at a preset target flow rate.

In an exemplary embodiment of the present invention, to circulate the cooling fluid of the vehicle through the cooling line L1 of the vehicle and the cooling line L2 of the charger at the preset target flow rate, the vehicle-side controller 180 may provide a signal for controlling the cooling fluid circulation pump P2 of the charger, to the charger-side controller 280.

The viscosity of the cooling fluid may vary depending on temperature since the cooling fluid is a liquid. With the viscosity variation of the cooling fluid, the flow rate of the cooling fluid may vary even though the cooling fluid circulation pump operates at the same rotating speed. Therefore, the rotating speed of the cooling fluid circulation pump may be controlled in view of the temperature of the cooling fluid.

For example, if the rotating speed of the circulation pump for circulating the cooling fluid of the vehicle through the cooling line L1 of the vehicle at reference temperature and 12 LPM is 3000 RPM, the rotating speed of the circulation pump when the temperature of the cooling fluid is not equal to the reference temperature may be provided by Equation 1 below.

$$\text{target } RPM = 3000\ RPM \times \frac{\text{viscosity of the cooling fluid at current temperature}}{\text{viscousity of the cooling fluid with 12 } LPM} \quad \text{Equation (1)}$$

The vehicle-side controller 180 may control the circulation pump to operate at the target RPM determined by Equation 1.

The charger-side controller 280 may control the circulation pump to operate at the target RPM determined by Equation 1.

12 LPM in Equation 1 is illustrative. The flow rate may be differently set depending on the type of battery charging system or battery charging equipment of the vehicle. In the instant case, the target RPM may be obtained in the above-described manner by substituting the corresponding flow rate instead of 12 LPM into Equation 1.

Furthermore, 3000 RPM in Equation 1 is illustrative. The rotating speed may be differently set depending on the type of battery charging system or battery charging equipment of the vehicle. In the instant case, the target RPM may be obtained in the above-described manner by substituting the corresponding rotating speed instead of 3000 RPM into Equation 1.

After that, when the battery of the vehicle is completely charged, the vehicle-side controller 180 controls the cooling line L1 of the vehicle to prevent the cooling fluid circulating through the cooling line L1 of the vehicle from flowing into the electric vehicle service equipment 200 (Step S1400).

For example, to prevent the cooling fluid circulating through the cooling line L1 of the vehicle from flowing into the electric vehicle service equipment 200, the vehicle-side controller 180 may control the valve 170 to prevent the cooling fluid of the vehicle from flowing from the cooling line L1 of the vehicle to the charge port 160.

When the battery of the vehicle is completely charged, the charger-side controller 280 may control the cooling line L2 of the charger to prevent the cooling fluid circulating through the cooling line L2 of the charger from flowing into the vehicle.

Additionally, the vehicle-side controller 180 may perform a process of determining whether the cooling fluid is leaked or not (Step S1500).

After the battery of the vehicle is completely charged, the vehicle-side controller 180 may determine whether the cooling fluid is leaked or not, by comparing the amounts of cooling fluid circulating through the cooling line L1 of the vehicle before and after the charging of the battery of the vehicle.

Figure 4:
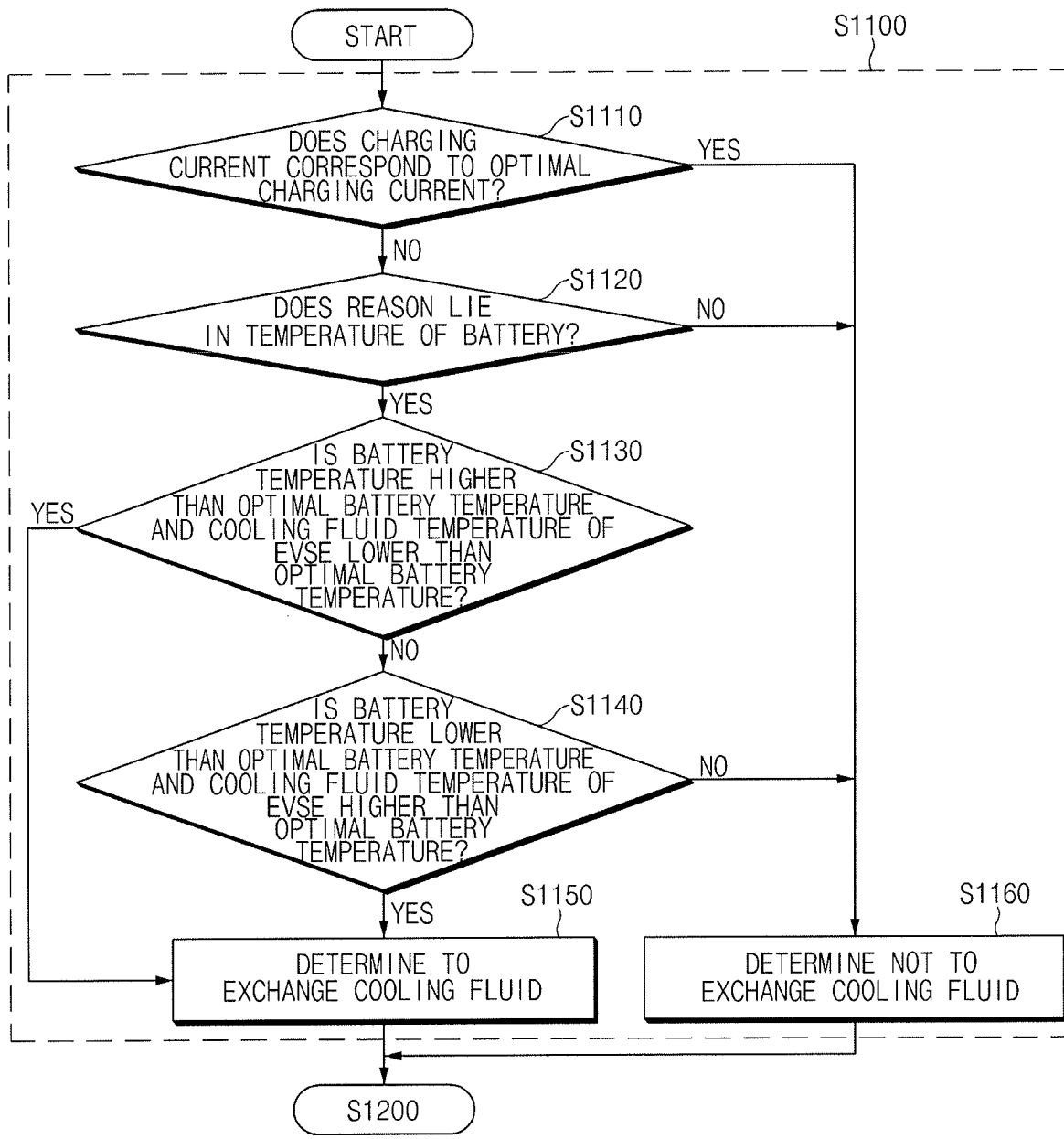
FIG. 4 is a flowchart illustrating step S1100 of FIG. 3 in more detail.

FIG. 4 is a flowchart illustrating step S1100 of FIG. 3 in more detail.

Referring to FIG. 4, the vehicle-side controller 180 may determine whether to exchange the cooling fluid between the vehicle and the electric vehicle service equipment 200, based on at least one of charging current flowing from the electric vehicle service equipment 200 to the battery of the vehicle, the temperature of the battery, the SOC value of the battery, information related to the cooling fluid of the vehicle, and information related to the cooling fluid of the charger. The vehicle-side controller 180 may determine whether to exchange the cooling fluid between the vehicle and the electric vehicle service equipment 200.

First, the vehicle-side controller 180 determines whether the charging current flowing from the electric vehicle service equipment 200 to the battery of the vehicle corresponds to preset optimal charging current (Step S1110).

The optimal charging current may be differently set depending on the type of the battery charging system 100. Furthermore, the optimal charging current may have a different value depending on the SOC value of the battery.

In an exemplary embodiment of the present invention, the vehicle-side controller 180 may determine whether the difference between the charging current and the preset optimal charging current exceeds a preset range. When it is determined that the difference between the charging current and the preset optimal charging current is within the preset range, the vehicle-side controller 180 may determine that the charging current corresponds to the preset optimal charging current, and when it is determined that the difference between the charging current and the preset optimal charging current exceeds the preset range, the vehicle-side controller 180 may determine that the charging current does not correspond to the preset optimal charging current.

When it is determined that the charging current corresponds to the preset optimal charging current, the vehicle-side controller 180 determines not to exchange the cooling fluid (Step S1160).

When it is determined that the charging current does not correspond to the preset optimal charging current, the vehicle-side controller 180 determines whether the reason why the charging current does not correspond to the preset optimal charging current lies in the temperature of the battery of the vehicle (Step S1120).

In an exemplary embodiment of the present invention, when it is determined that the charging current does not correspond to the preset optimal charging current and the battery is at a high SOC whish is higher than a predetermined value, the vehicle-side controller 180 may determine that the reason why the charging current does not correspond to the preset optimal charging current does not lie in the temperature of the battery of the vehicle. That is because the charging current may fall when the battery is at the high SOC, that is, when the battery is nearly fully charged.

In an exemplary embodiment of the present invention, when it is determined that the charging current does not correspond to the preset optimal charging current and the voltage of battery reaches a cut-off voltage, the vehicle-side controller 180 may determine that the reason why the charging current does not correspond to the preset optimal charging current does not lie in the temperature of the battery of the vehicle. That is because the charging current may fall when the voltage of the battery reaches the cut-off voltage.

When it is determined that the charging current does not correspond to the preset optimal charging current and the temperature of the battery is higher or lower than a preset optimal battery temperature, the vehicle-side controller 180 may determine that the reason why the charging current does not correspond to the preset optimal charging current lies in the temperature of the battery of the vehicle.

In an exemplary embodiment of the present invention, when it is determined that the difference between the temperature of the battery of the vehicle and the preset optimal battery temperature exceeds a predetermined range, the vehicle-side controller 180 may determine that the reason why the charging current does not correspond to the preset optimal charging current lies in the temperature of the battery of the vehicle.

The vehicle-side controller 180 may determine whether to exchange the cooling fluid between the vehicle and the electric vehicle service equipment 200, further based on the temperature of the battery of the vehicle, the preset optimal battery temperature, and the temperature of the cooling fluid of the electric vehicle service equipment 200.

The vehicle-side controller 180 determines whether the temperature of the battery of the vehicle is higher than the preset optical battery temperature and the temperature of the cooling fluid of the electric vehicle service equipment 200 is lower than the preset optimal battery temperature (Step S1130).

When it is determined that the temperature of the battery of the vehicle is higher than the preset optical battery temperature and the temperature of the cooling fluid of the electric vehicle service equipment 200 is lower than the preset optimal battery temperature, the vehicle-side controller 180 determines to exchange the cooling fluid between the vehicle and the electric vehicle service equipment 200 (Step S1150).

When the determination result in step S1130 corresponds to "NO", the vehicle-side controller 180 determines whether the temperature of the battery of the vehicle is lower than the preset optimal battery temperature and the temperature of the cooling fluid of the electric vehicle service equipment 200 is higher than the preset optimal battery temperature (Step S1140).

When it is determined that the temperature of the battery of the vehicle is lower than the preset optical battery temperature and the temperature of the cooling fluid of the electric vehicle service equipment 200 is higher than the preset optimal battery temperature, the vehicle-side controller 180 determines to exchange the cooling fluid between the vehicle and the electric vehicle service equipment 200 (Step S1150).

When the determination result in step S1140 corresponds to "NO", the vehicle-side controller 180 determines not to exchange the cooling fluid between the vehicle and the electric vehicle service equipment 200 (Step S1160).

That is, the vehicle-side controller 180 determines to exchange the cooling fluid between the vehicle and the electric vehicle service equipment 200 only when the temperature of the battery of the vehicle is higher than the preset optimal battery temperature and the temperature of the cooling fluid of the electric vehicle service equipment 200 is lower than the preset optimal battery temperature, or the temperature of the battery of the vehicle is lower than the preset optimal battery temperature and the temperature of the cooling fluid of the electric vehicle service equipment 200 is higher than the preset optimal battery temperature.

According to the above-configured battery charging system 100 and the method of charging the electric vehicle including the same, the cooling fluid may be exchanged between the vehicle and the electric vehicle service equipment 200 to allow the temperature of the battery to be closer to the optimal temperature, in the case where cooling the battery of the vehicle with the cooling fluid flowing through the cooling line L2 of the charger is more advantageous than cooling the battery of the vehicle with the cooling fluid flowing through the cooling line L1 of the vehicle.

The charging current flowing from the electric vehicle service equipment 200 to the battery of the vehicle may not reach the optimal charging current due to heat generated in the process in which the battery of the vehicle is charged, with the battery charging system 100 of the electric vehicle and the electric vehicle service equipment 200 coupled together. According to an exemplary embodiment of the present invention, the cooling fluid may cool the charge port 160 and the connector 260 while flowing through the charge port 160 and the connector 260, and therefore the charging current flowing from the electric vehicle service equipment 200 to the battery of the vehicle may approach the optimal charging current, improving charging performance.

Furthermore, according to an exemplary embodiment of the present invention, after the battery is completely charged, the leakage of the cooling fluid may be determined by comparing the amounts of cooling fluid before and after the charging.

The present invention described above may be implemented as a computer readable code in a computer readable recording medium. The computer readable recording medium may include all types of storage devices for storing data which may be read by a computer system. Examples of the computer readable recording medium may include a hard disk drive (HDD), a solid state disk (SSD), a silicon disk drive (SDD), a ROM, a RAM, a CD-ROM, a magnetic tape, a floppy disk, an optical data storage device, and the like. The computer readable recording medium may be implemented in a form of a carrier wave (e.g., transmission over the Internet). Furthermore, the computer may include a processor or a controller. The above embodiments are therefore to be construed in all aspects as illustrative and not restrictive. The scope of the present invention may be determined by the appended claims and their legal equivalents, not by the above description, and all changes coming within the meaning and equivalency range of the appended claims are intended to be embraced therein.

According to the exemplary embodiments of the present invention, at least the following effects are achieved.

When receiving electric power from the electric vehicle service equipment to charge the battery, the electric vehicle may perform the charge control, based on the result obtained by determining whether to exchange the cooling fluid, to cause the cooling fluid flowing through the cooling line of the vehicle to flow into the cooling line of the charger and the cooling fluid flowing through the cooling line of the charger to flow into the cooling line of the vehicle, cooling the battery charging system of the vehicle with the cooling fluid of the charger. Accordingly, the electric vehicle may reduce charging power consumed to charge the battery thereof.

Furthermore, the electric vehicle may maintain the battery at an appropriate temperature, increasing battery charging efficiency.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method for charging an electric vehicle, the method comprising:
    (a) a step of determining, by a vehicle-side controller, whether to exchange cooling fluid between the electric vehicle and an electric vehicle service equipment (EVSE), when a charge port of the electric vehicle and a connector of the electric vehicle service equipment are connected together, wherein the charge port is connected to a first cooling line in the electric vehicle and the connector is connected to a second cooling line in the EVSE, and wherein the first cooling line is fluidically connected to at least one of an electronic part or a battery module directly to form a closed loop with the at least one of the electronic part or the battery module;
    (b) a step of providing, by the vehicle-side controller, a signal which requests an exchange of the cooling fluid to a charger-side controller of the EVSE after determining to exchange the cooling fluid; and
    (c) a step of controlling, by the vehicle-side controller, the first cooling line of the electric vehicle through which cooling fluid in the first cooling line of the electric vehicle circulates, to flow the cooling fluid of the electric vehicle into the second cooling line of the electric vehicle service equipment through the charge port,
    wherein the step (a) includes:
        a step of performing, by the vehicle-side controller, charge control to charge a battery of the electric vehicle with electric power supplied from the electric vehicle service equipment; and
        a step of determining, by the vehicle-side controller, whether to exchange the cooling fluid between the electric vehicle and the electric vehicle service equipment, based on a charging current flowing from the electric vehicle service equipment to the battery of the electric vehicle and a preset optimal charging current, and wherein the vehicle-side controller determines not to exchange the cooling fluid between the electric vehicle and the electric vehicle service equipment, when it is determined by the vehicle-side controller that the charging current corresponds to the preset optimal charging current, and
    wherein the vehicle-side controller determines to exchange the cooling fluid between the electric vehicle and the electric vehicle service equipment, when it is determined by the vehicle-side controller that the charging current does not correspond to the preset optimal charging current.

2. The method of claim 1, wherein when it is determined that a difference between the charging current and the preset optimal charging current is within a preset range, the vehicle-side controller is configured to determine that the charging current corresponds to the preset optimal charging current.

3. The method of claim 1,
    wherein the vehicle-side controller determines to exchange the cooling fluid between the vehicle and the electric vehicle service equipment, when it is determined by the vehicle-side controller that the charging current does not correspond to the preset optimal charging current and a reason why the charging current does not correspond to the preset optimal charging current lies in a temperature of the battery of the electric vehicle; and
    wherein the vehicle-side controller determines not to exchange the cooling fluid between the electric vehicle and the electric vehicle service equipment, when it is determined by the vehicle-side controller that the charging current does not correspond to the preset optimal charging current and the reason why the charging current does not correspond to the preset optimal charging current does not lie in the temperature of the battery of the electric vehicle.

4. The method of claim 3, wherein the vehicle-side controller is configured to determine that the reason why the charging current does not correspond to the preset optimal charging current lies in the temperature of the battery of the electric vehicle, when it is determined by the vehicle-side controller that a difference between the temperature of the battery of the electric vehicle and a preset optimal battery temperature exceeds a predetermined range.

5. The method of claim 3, wherein the vehicle-side controller is configured to determine that the reason why the charging current does not correspond to the preset optimal charging current lies in the temperature of the battery of the electric vehicle, when it is determined by the vehicle-side controller that voltage of the battery reaches a cut-off voltage.

6. The method of claim 1, wherein the vehicle-side controller is configured to determine whether to exchange the cooling fluid between the electric vehicle and the electric vehicle service equipment, further based in a state of charge (SOC) value of the battery of the electric vehicle, when it is determined by the vehicle-side controller that the charging current does not correspond to the preset optimal charging current.

7. The method of claim 6, wherein the vehicle-side controller is configured to determine that the reason why the charging current does not correspond to the preset optimal charging current lies in a temperature of the battery of the electric vehicle, when it is determined by the vehicle-side controller that the state of charge (SOC) value of the battery of the electric vehicle is higher than a predetermined value.

8. The method of claim 1, wherein the vehicle-side controller is configured to determine whether to exchange the cooling fluid between the electric vehicle and the electric vehicle service equipment, further based on a temperature of the battery of the electric vehicle, a preset optimal battery temperature, and a temperature of cooling fluid of the electric vehicle service equipment.

9. The method of claim 8, wherein the vehicle-side controller is configured to determine to exchange the cooling fluid between the electric vehicle and the electric vehicle service equipment only when the temperature of the battery of the electric vehicle is higher than the preset optimal battery temperature and the temperature of the cooling fluid of the electric vehicle service equipment is lower than the preset optimal battery temperature, or the temperature of the battery of the electric vehicle is lower than the preset optimal battery temperature and the temperature of the cooling fluid of the electric vehicle service equipment is higher than the preset optimal battery temperature.

10. The method of claim 1,
wherein in the step (c), the vehicle-side controller is configured to control a first cooling fluid circulation pump of the electric vehicle, configured to provide a signal which controls a second cooling fluid circulation pump of the electric vehicle service equipment to the charger-side controller, and configured to circulate the cooling fluid of the electric vehicle through the first cooling line of the electric vehicle and the second cooling line of the electric vehicle service equipment at a preset target flow rate of the cooling fluid,
wherein the first cooling fluid circulation pump is fluidically connected to the first cooling line of the electric vehicle, and
wherein the second cooling fluid circulation pump is fluidically connected to the second cooling line of the EVSE.

11. The method of claim 10, wherein the vehicle-side controller is configured to control an operating revolutions per minute (RPM) of the first cooling fluid circulation pump of the electric vehicle or provides the signal which controls the second cooling fluid circulation pump of the electric vehicle service equipment to the charger-side controller, based on a temperature of the cooling fluid flowing through the first cooling line of the electric vehicle.

12. The method of claim 1, further including:
(d) a step of controlling, by the vehicle-side controller after the step (c), the first cooling line of the electric vehicle to prevent the cooling fluid circulating through the first cooling line of the electric vehicle from flowing into the electric vehicle service equipment, when the battery of the electric vehicle is completely charged.

13. The method of claim 12,
wherein the first cooling line of the electric vehicle includes a control valve mounted between the first cooling line and the charge port, and
wherein the vehicle-side controller is configured to control the control valve to prevent the cooling fluid of the vehicle from flowing from the first cooling line of the electric vehicle to the charge port.

14. The method of claim 12, further including:
(e) a step of determining, by the vehicle-side controller after the step (d), leakage of the cooling fluid by comparing amounts of the cooling fluid circulating through the first cooling line of the electric vehicle before and after the battery of the electric vehicle is charged, after the battery of the electric vehicle is completely charged.

15. A battery charging system for an electric vehicle, the battery charging system comprising:
a vehicle-side controller having:
at least one processor; and
a memory connected to the at least one processor and configured to store a plurality of instructions;
a first cooling line connected to the vehicle-side controller and having cooling fluid circulating therethrough to cool a battery of the electric vehicle, wherein the first cooling line is fluidically connected to at least one of an electronic part or a battery module directly to form a closed loop with the at least one of the electronic part or the battery module, wherein the battery module includes the battery
wherein the at least one processor is configured to:
determine whether to exchange the cooling fluid between the electric vehicle and an electric vehicle service equipment, when a charge port of the electric vehicle connected to the first cooling line and a connector of the electric vehicle service equipment connected to a second cooling line are connected together;
provide a signal which requests an exchange of the cooling fluid to a charger-side controller of the electric vehicle service equipment after determining to exchange the cooling fluid;
control the first cooling line of the electric vehicle to flow the cooling fluid in the first cooling line of the electric vehicle into the second cooling line of the electric vehicle service equipment through the charge port;
perform charge control to charge the battery of the electric vehicle with electric power supplied from the electric vehicle service equipment; and
determine whether to exchange the cooling fluid between the electric vehicle and the electric vehicle service equipment, based on a charging current flowing from the electric vehicle service equipment to the battery of the electric vehicle and a preset optimal charging current, and
wherein the at least one processor is further configured to:
determine not to exchange the cooling fluid between the electric vehicle and the electric vehicle service equipment, when the charging current corresponds to the preset optimal charging current, and
determine to exchange the cooling fluid between the electric vehicle and the electric vehicle service equipment, when the charging current does not correspond to the preset optimal charging current.

* * * * *